(12) United States Patent
Watanabe et al.

(10) Patent No.: US 6,497,580 B2
(45) Date of Patent: Dec. 24, 2002

(54) CONNECTOR AND A CONNECTING STRUCTURE OF CIRCUIT BOARDS THEREWITH

(75) Inventors: Hiroshi Watanabe, Shizuoka (JP); Mitsunobu Kato, Shizuoka (JP)

(73) Assignee: Yazaki Corporation, Tokyo (JP)

( * ) Notice: Subject to any disclaimer, the term of this patent is extended or adjusted under 35 U.S.C. 154(b) by 0 days.

(21) Appl. No.: 09/791,819

(22) Filed: Feb. 26, 2001

(65) Prior Publication Data

US 2001/0019904 A1 Sep. 6, 2001

(30) Foreign Application Priority Data

Mar. 1, 2000 (JP) .................................. 2000-055460
Sep. 7, 2000 (JP) .................................. 2000-271366

(51) Int. Cl.$^7$ ............................................. H01R 12/00
(52) U.S. Cl. ........................ 439/65; 439/358; 439/31; 439/862
(58) Field of Search ........................... 439/65, 31, 862, 439/358

(56) References Cited

U.S. PATENT DOCUMENTS 3,715,706 A * 2/1973 Michel et al. ................ 439/65
4,693,529 A * 9/1987 Stillie .......................... 439/65
4,715,819 A * 12/1987 Iwasa et al. .................. 439/65

FOREIGN PATENT DOCUMENTS

| EP | 0 546 804 A2 * | 6/1993 | ............... 439/65 |
| JP | 10-302909 | 11/1998 | |
| JP | 11-67340 | 3/1999 | |
| JP | 11-86964 | 3/1999 | |
| JP | 2000-268926 | 9/2000 | |

* cited by examiner

Primary Examiner—Tho D. Ta
(74) Attorney, Agent, or Firm—Armstrong, Westerman & Hattori, LLP

(57) ABSTRACT

A connector and a connecting structure of circuit boards therewith is provided, which includes: a first circuit board; a second circuit board orthogonally arranged relative to the first circuit board; a terminal having first and second contact portions for the respective first and second circuit boards; and a housing to accommodate the terminal. An engaging member for attaching the housing to the first circuit board projects from the housing, and the first contact portion projects in a same direction as the engaging member. The engaging member is longitudinally movable at an engaging portion provided on the first circuit board. The engaging member is pivotable. The housing consists of a pair of housings turnable about a hinge, and a second contact portion of the terminal is accommodated between the housings. A groove as a positioning portion for a housing is provided. The housing consists of a fixed-side housing having the engaging member for the first circuit board and a moving-side housing movable relative to the fixed-side housing, and the terminal is accommodated in the moving-side housing. A shaft portion is provided on either one of the fixed-side housing and the moving-side housing, and a shaft engaging portion to movably engage the shaft portion is provided on the other of the fixed-side housing and the moving-side housing. A moving-side housing engaging portion is provided on the first circuit board, and an engaging portion for the moving-side housing engaging portion is provided on the moving-side housing.

21 Claims, 11 Drawing Sheets

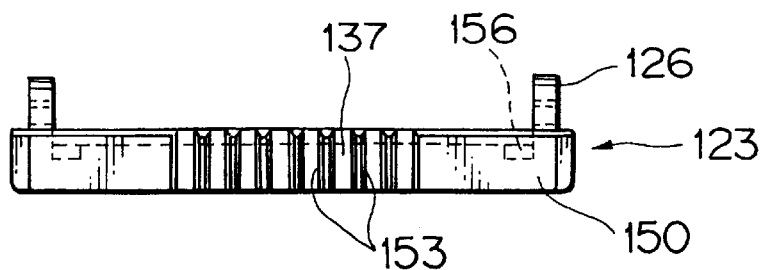
F I G. 1 1
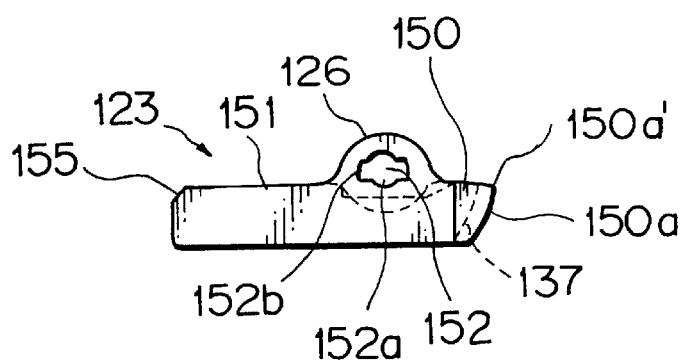
F I G. 1 2
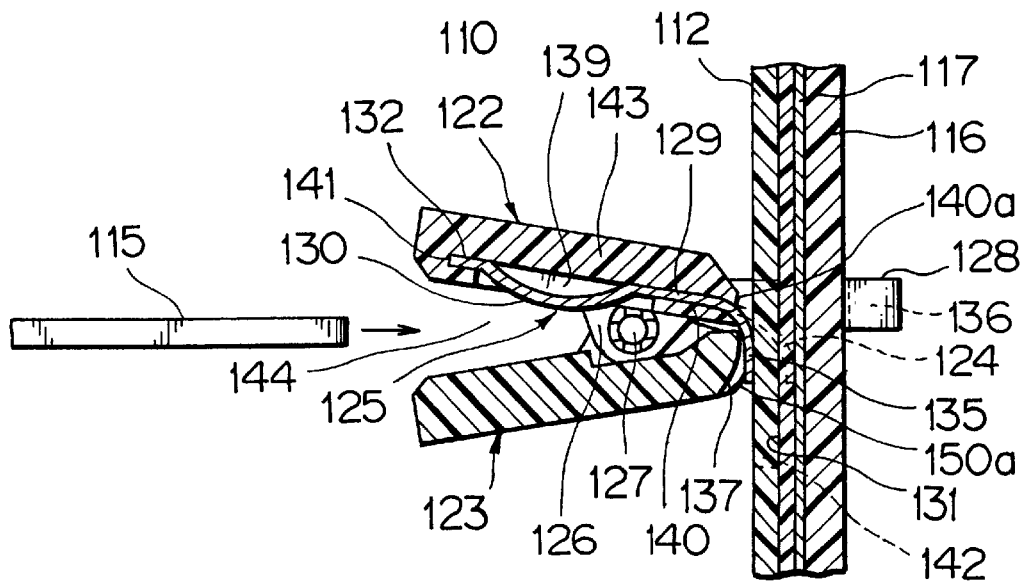
F I G. 1 3

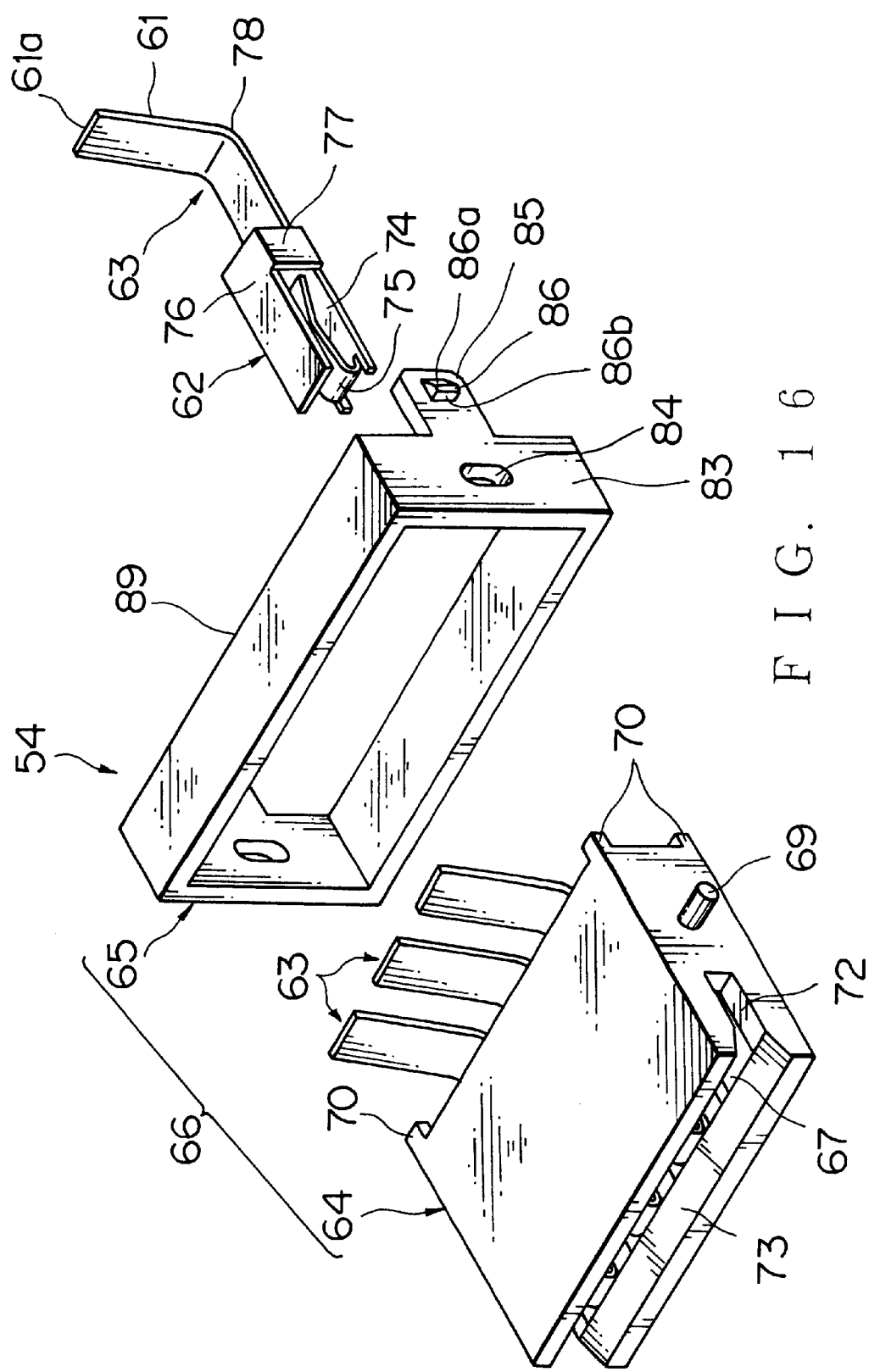

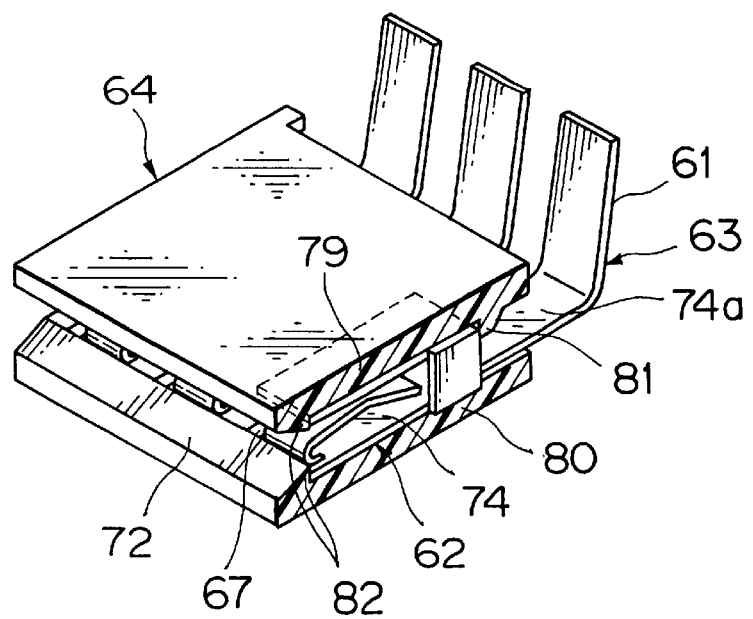
F I G. 1 7

CONNECTOR AND A CONNECTING STRUCTURE OF CIRCUIT BOARDS THEREWITH

BACKGROUND OF THE INVENTION

1. Field of the Invention

The present invention relates to a connector and a connecting structure of circuit boards therewith, wherein two crossing or perpendicularly arranged circuit boards are electrically connected with a connector having surface contact-type terminals.

2. Description of the Related Art

FIGS. 19, 20 show a connecting structure of a connector and a circuit assembly disclosed in Japanese Patent Application Laid-open No. 11-67340.

In this structure, as shown in FIG. 19, a wiring harness 98, namely a circuit assembly, is arrange between a door, panel 95 and a door trim 96 of a motor vehicle through a waterproof sheet 97, and a connector 99 of the wiring harness 98 and a connector 101 of a switch unit 100, namely one of accessories to be assembled to the door trim, are connected.

As shown in FIG. 20, the connector 99 on a side of the circuit assembly projects toward the door trim 96 in a state of provisional engagement with a holder 102. The holder 102 is fixed to the door panel 95. The connector 101 on a side of accessory 100 has a plurality of male terminals 103 inside thereof, the connector 102 on a side of the circuit assembly has a plurality of female terminals 104 inside thereof, and the female terminals 104 are pressure-welded to the respective electric wires 105 of the circuit assembly.

Upon assembling the accessory 100 to the door trim 96 (FIG. 19) in a state that the door trim 96 has been assembled to the door panel 95, the connector 101 is coupled with the connector 99, while both the connectors 99,101 enter the holder 102. The above structure is applicable to a case of an instrument panel, not limited to a door of a motor vehicle.

With respect to the above prior art, however, when connecting the circuit assembly 98 with the accessory 100, the circuit assembly should be of a flexible wire (i.e. a wiring harness) especially so as to absorb a possible position divergence. Therefore, much man-hour is required for arrangement work of the circuit assembly 98 since the circuit assembly 98 is complicated, and also the structure is not compact and the cost is fairly large. Specifically, pressure-welding work between the electric wires 105 as the circuit assembly 98 and the terminals 104 and inserting work of the terminals 104 into the connector 99 require much man-hour, and also assembling workability is not good.

SUMMARY OF THE INVENTION

In view of the foregoing, an object of the present invention is to provide a connector and a connecting structure of circuit boards therewith, wherein circuit boards as a circuit assembly can be easily and securely connected compactly with good workability, without using a flexible electric wire.

In order to achieve the above object, as a first aspect of the present invention, a connector for connecting orthogonally arranged circuit boards comprises: a first circuit board; a second circuit board orthogonally arranged relative to the first circuit board; a terminal having first and second contact portions for the respective first and second circuit boards; and a housing to accommodate the terminal.

As a second aspect of the present invention, an engaging member for attaching the housing to the first circuit board projects from the housing, and the first contact portion projects in a same direction as-the engaging member.

As a third aspect of the present invention, the engaging member is pivotable.

As a fourth aspect of the present invention, the engaging member is longitudinally movable at an engaging portion provided on the first circuit board.

As a fifth aspect of the present invention, the housing consists of a pair of housings turnable about a hinge, and a second contact portion of the terminal is accommodated between the housings.

As a sixth aspect of the present invention, a shaft portion of the hinge is formed integrally with the engaging member.

As a seventh aspect of the present invention, the housings are supported by an elastic member in an opened state, and the opened state supported by the elastic member is removed by an end of the second circuit board.

As an eighth aspect of the present invention, the housings have respective opposite sloping portions on which the end of the second circuit board abuts for closing the housings.

As a ninth aspect of the present invention, a holding portion to hold a middle portion of the terminal is provided on the first the housing.

As a tenth aspect of the present invention, the housing consists of a fixed-side housing having the engaging member for the first circuit board and a moving-side housing movable relative to the fixed-side housing, and the terminal is accommodated in the moving-side housing.

As an eleventh aspect of the present invention, a shaft portion is provided on either one of the fixed-side housing and the moving-side housing, and a shaft engaging portion to movably engage the shaft portion is provided on the other of the fixed-side housing and the moving-side housing.

As a twelfth aspect of the present invention, the moving-side housing is movable in the fixed-side housing in an axial direction of the shaft portion.

As a thirteenth aspect of the present invention, in a connecting structure of the circuit boards with the connector, the first circuit board is resilient, and a connector engaging portion to engage the engaging member is bored through both of the first circuit board and the panel so that the panel is supported by the engaging member.

As a fourteenth aspect of the present invention, a moving-side housing engaging portion is provided on the first circuit board, and an engaging portion for the moving-side housing engaging portion is provided on the moving-side housing.

As a fifteenth aspect of the present invention, a plurality of slots are provided on the first circuit board so as to permit the first circuit board to be bent.

As a sixteenth aspect of the present invention, the first circuit board is securely put between the fixed-side housing and the panel in a state that the engaging member engages the connector engaging portion of the panel.

As a seventeenth aspect of the present invention, the terminal is formed generally in a L-shape, and the first and second contact portions of the terminal are first and second elastic contact portions, respectively.

As an eighteenth aspect of the present invention, a positioning portion to engage the first elastic contact portion of the terminal is provided on an front end portion of the housing.

As a nineteenth aspect of the present invention, the positioning portion is provided on one of the pair of housings of the fifth aspect, the one of the pair of housings being one not accommodating the terminal.

As a twentieth aspect of the present invention, the positioning portion is a groove to receive the first elastic contact portion therein.

As a twenty-first aspect of the present invention, the front end portion of the housing having the positioning portion is a circular-arc surface formed about the hinge as a center thereof.

According to the above-described structures of the present invention, the following advantages are provided.

(1) Since a flexible electric wire is not required for connecting circuit boards, the connecting structure is simplified and compact-sized, and manufacture man-hour is reduced, thereby reducing the costs.

(2) Since the second circuit board is put into contact with the second contact portion of the connector in a state that the connector is secured to the first circuit board by the engaging member and the first contact portion is put into electrical contact with the first circuit board, the connecting work can be facilitated and working man-hour can be reduced.

(3) Since the engaging member is turnable, a position divergence between the connector and circuit boards can be absorbed, thereby assuring the electric connection between the contact portions of the connector and the circuit boards.

(4) Since the connector is movable in a longitudinal direction of the first circuit board within a range of a gap between the engaging hole and the engaging member, a position divergence, in the longitudinal direction of the first circuit board, of the connector, or namely the second circuit board, with respect to the first circuit board can be absorbed, thereby securely connecting the second circuit board to the first circuit board without using a conventional flexible electric wire.

(5) Since the second circuit board can be sandwiched between both the housings, the second circuit board can be easily and securely connected to the second contact portions of the terminals, thereby improving the connection workability. And, since the housings can be closed and opened about the hinge, the attaching/detaching workability of the terminals is improved.

(6) Since the shaft portion of the hinge is integrated with the engaging member, the structure can be simplified, and reduction of parts and improvement of assembly work can be attained, thereby reducing the cost.

(7) Since the housings are kept open and closed by inserting the second circuit board therebetween, the second circuit board can be easily connected to the connector.

(8) Since the housings are closed by pushing the sloping portions by the second circuit board, the second circuit board is easily securely connected to the contact portions of the terminals in the housings with strong contact pressure, thereby reducing connecting work man-hour.

(9) Since a middle portion of the terminal is held by the holding portion of the housing, the terminal can be kept stable. And also, assembly work of the terminal to the housing can be facilitated, and assembly man-hour can be reduced.

(10) Since the fixed-side housing is securely supported by the first circuit board by means of the engaging member, when the second circuit board is inserted into the moving-side housing inside the fixed-side housing, a position divergence between the second circuit board and the first circuit board can be absorbed by movement of the moving-side housing, thereby smoothly securely connecting the connector to the second circuit board.

(11) Since the moving-side housing can move with respect to the fixed-side housing due to a gap between the shaft engaging portion and the shaft portion, even if there is a position divergence between the first circuit board and the fixed-side housing, the contact portion of the terminal in the moving-side housing can be securely electrically connected to the first circuit board.

(12) Since the moving-side housing can shift in an axial direction of the shaft portion, a position divergence of the circuit conductors of the first circuit board can be absorbed.

(13) Since the first circuit board is supported by the engaging member of the fixed-side housing, any other fixing means for the first circuit board is not required, thereby simplifying the structure and reducing the cost.

(14) Since the engaging portion of the moving-side housing engages the moving-side housing engaging portion of the resilient circuit board, the terminals of the moving-side housing are always accurately put into contact with the circuit conductors of the resilient circuit board without a position divergence, thereby improving reliability in electrical connection therebetween.

(15) Since a portion of the first circuit board inside the slots can laterally and vertically shifts along with the moving-side housing, the terminals of the moving-side housing are always further accurately put into contact with the circuit conductors of the resilient circuit board without a position divergence, thereby further improving reliability in electrical connection therebetween.

(16) Since the resilient first circuit board is tightly put between the panel and the fixed-side housing, degree of flatness of the first circuit board can be improved, thereby enhancing reliability in electrical connection between the connector and the resilient first circuit board.

(17) Since the elastic contact portions on respective ends of the generally L-shaped terminal are put into elastic contact with the respective first and second circuit boards generally orthogonally arranged each other, position divergence between the terminal and the first and second circuit boards can be absorbed within ranges of elastic deformation of the elastic contact portions, thereby attaining securely electrical connection of the first and second circuit boards with sufficient contact pressure.

(18) Since the first elastic contact portions of the terminals projecting from the housing are positioned by means of the positioning portion, contacting, or short circuit, of the elastic contact portions can be prevented, and the elastic contact portions are accurately positioned to the respective circuit conductors of the first circuit board, thereby ensuring large or sufficient contacting area.

(19) The second contact portions of the L-shaped terminals are accommodated in one housing, and the first contact portions project outside from the one housing. And, the end side portions (the free end side) of the first contact portions are positioned by means of the positioning portion of the other housing. Therefore, since rotative movement of the first contact portions is very small, contacting of the elastic contact portions can be securely prevented, and the elastic contact portions are accurately positioned to the respective circuit conductors of the first circuit board, thereby ensuring large or sufficient contacting area.

(20) Since the elastic contact portions of the terminals are accommodated inside the grooves as the positioning portion, even if the connector is strongly pushed against the first circuit board when the second circuit board inserted therein, the elastic contact portions are protected in the grooves, thereby preventing the elastic contact portions from being deformed or damaged.

(21) Since the circular-arc front end surface of the housing smoothly slips on the first circuit board when the housings turns about the hinges, the second circuit board can be inserted inside the connector smoothly and also both the circuit boards can be easily connected to the connector, thereby improving connecting workability and enhancing reliability in electrical connection.

The above and other objects and features of the present invention will become more apparent from the following description taken in conjunction with the accompanying drawings.

BRIEF DESCRIPTION OF THE DRAWINGS

FIG. 11 is a front view showing the lower housing.

FIG. 12 is a side view showing the lower housing;

FIG. 13 is a longitudinal sectional view showing a state of inserting a second circuit board into the connector;

FIG. 16 is an exploded perspective view showing the connector of FIG. 15;

FIG. 17 is a cutaway perspective view showing an accommodating state of the terminals in the connector;

FIG. 19 is an exploded perspective view showing a prior art connecting structure of a circuit assembly and a connector.

DESCRIPTION OF THE PREFERRED EMBODIMENT(S)

Embodiments of the present invention will now be described in further detail with reference to the accompanying drawings.

Figure 1:
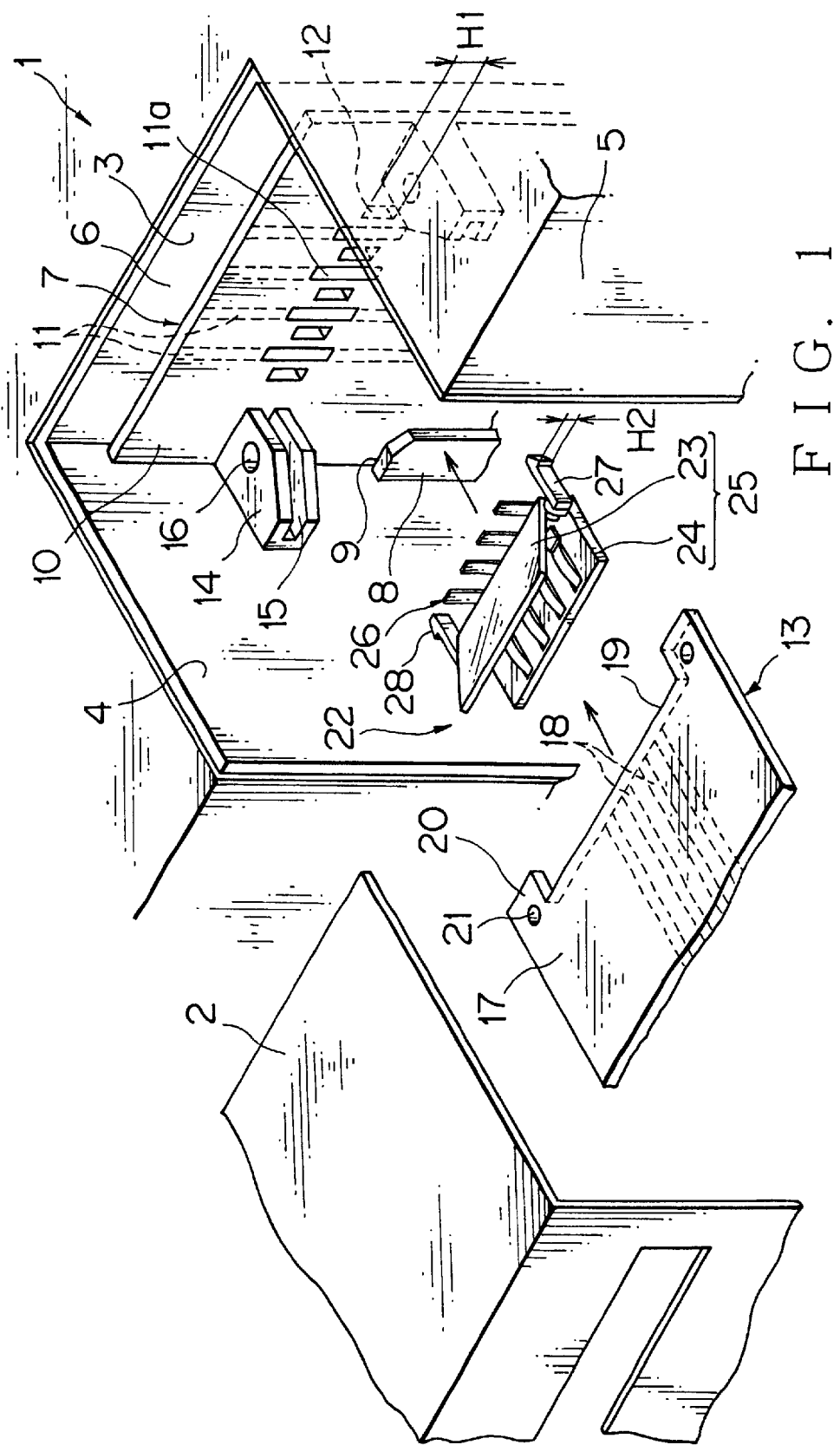
FIG. 1 is an exploded perspective view showing a first embodiment of a connector and a connecting structure of circuit boards therewith in accordance with the present invention.
Figure 2:
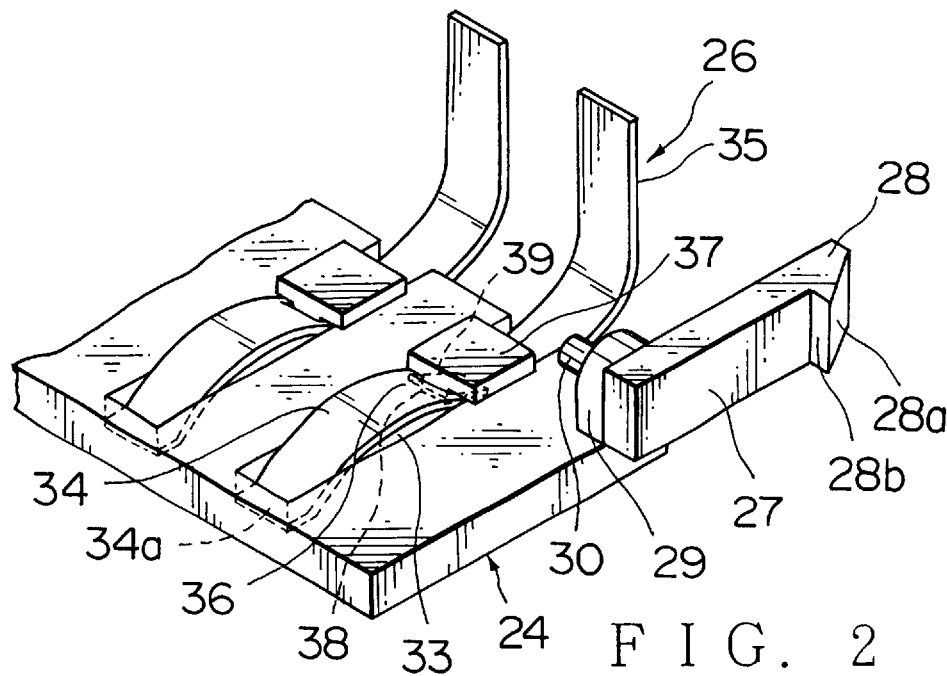
FIG. 2 is a perspective view partly showing a lower housing of the connector including terminals.
Figure 3:
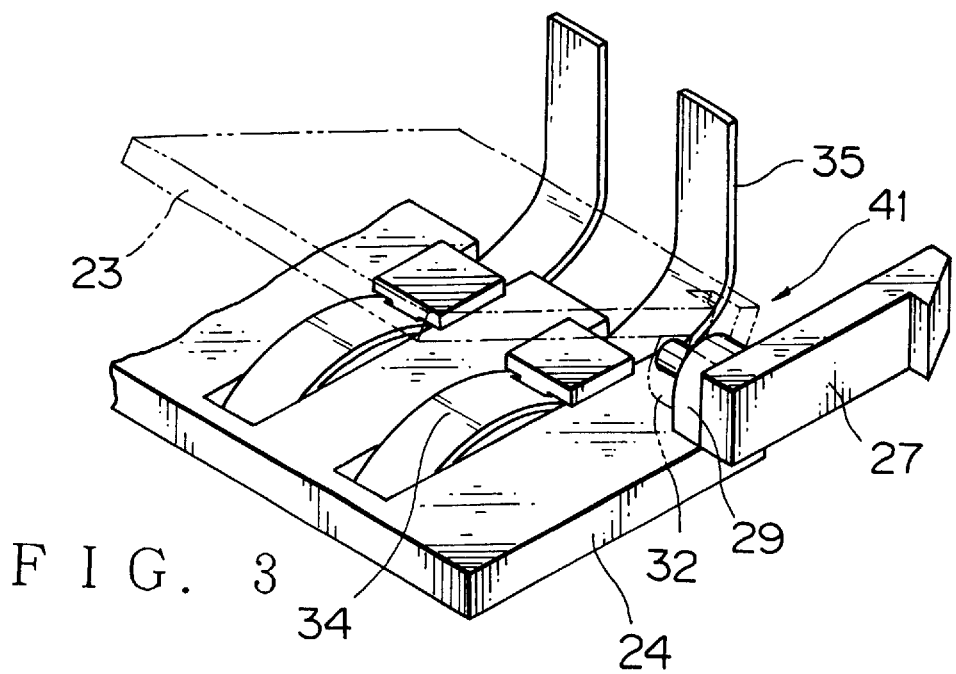
FIG. 3 is a perspective view showing an assembly state of the connector further including an upper housing.

FIGS. 1–3 show a first embodiment of a connector and a connecting structure of circuit boards therewith in accordance with the present invention. The present embodiment applies to the connection of circuit assemblies (i.e. circuit boards) and accessories of a motor vehicle. In FIG. 1, 1 designates a casing as an instrument panel core, 2 designates a cover as a cluster.

The casing 1 has a vertical rear wall 3, sidewalls 4, and flange walls 5, and a space 6 is provided among them. A first circuit board 7 that is vertically accommodated in the space 6. A first guide portion 8 is vertically provided on each of the sidewalls 4, and the first circuit board 7 slidably engages guide grooves 9 behind the respective first guide portions 8. In this embodiment, a cover 2 side, i.e. driver's side, is defined as a front side of the casing 1.

The first circuit board 7 is a circuit assembly on a side of the instrument panel and has flat circuit conductors 11 of, for example, a power circuit and/or a signal circuit in parallel with uniform intervals on the face of an insulated board 10 made of synthetic resin. Each flat circuit conductor 11 has an exposed portion (an exposed conductor) 11a exposed from the insulating cover of the insulated board 10. Rectangular engaging holes (engaging portions) 12 to engage a connector 22 the insulated board 10 are arranged in parallel.

A second guide portion 14 is horizontally provided on each side of the insulated board 10 for guiding a second circuit board 13 for the accessory. The second guide portion 14 has a horizontal guide groove 15 and a vertical hole portion 16 for fixing the circuit board.

The second circuit board 13 is a printed circuit board and is connected to a non-shown accessory arranged inside the cover 2. The second circuit board 13 has a plurality of parallel circuit conductors 18 on the back of an insulated board 17 made of synthetic resin. The circuit conductors 18 are exposed at their ends. The second circuit board 13 has a recess 19 at the end and projecting portions 20 at the both sides of the recess 19, projecting portions 20 each have a hole portion 21 relative to the hole portion 16 of the second guide portion 14. The second circuit board 13 is fixed to the second guide portions 14 by a non-shown fixing means such as bolts and nuts or fixing clips.

The connector 22 is connected to the end of the second circuit board 13. The connector 22 has upper and lower housings 23,24, made of synthetic resin and being pivotable each other, and generally L-shaped terminals 26 whose rear half portions are accommodated in the lower housing 24 and whose front half portions project toward the first circuit board. The housing 23,24 constitute a connector housing 25. Here, a first circuit board 7 side of the connector 22 is defined as its front.

A pair of engaging arms (engaging members) 27 made of synthetic resin are pivotably provided on the respective sides of the lower housing 24 toward the first circuit board 7. Each engaging arm 27 has an outwardly-facing claw-like engaging projection 28 at the front end. The engaging projection 28 engages the engaging hole 12 of the first circuit board 7. The engaging arms 27 are positioned at the vertical center of the upper and lower housings 23,24.

A vertical length H1 of the engaging holes 12 is larger in some extent than a vertical width H2 of the engaging projections 28 (i.e. the engaging arms 27) so as to absorb a vertical position divergence of the connector 22. The length of the exposed conductor 11a of the first circuit board 7 is a little longer than the length of the engaging holes 12.

In this embodiment, since a plurality of engaging holes 12 are provided on the first circuit board 7, attaching place of the connector 22 can be changed according to the circuit conductors 11.

As shown in FIG. 2, a bearing 29 of semicircle tabular is provided upward on both sides of the front end portion of the lower housing 24. And, a short cylindrical shaft portion 30 provided inwardly at the proximal end of each engaging arm 27 is put through each bearing 29. As shown in FIG. 3, a bearing 32 provided on both sides of the front end of the upper housing 23 also engages the shaft portion 30 (FIG. 2). A coming-out preventing means may be provided at the end of each shaft portion 30.

The engaging arm 27 has a lateral resilience so that the engaging arm 27 can bend inward while a slant plane 28a of the engaging projection 28 slides on the edge of the engaging hole 12 of the first circuit board 7 (FIG. 1). On the completion of the slide of the engaging arm 27 against the edge of the engaging hole 12 the engaging arm 27 resiles outward, and an engaging plane 28b of the engaging projection 28 engages the back of the first circuit board 7. The engaging arm 27 projects toward the first circuit board 7 a little larger than the terminal 26.

A plurality of terminal accommodating grooves 33 are formed in the lower housing 24 in parallel. The depth of the terminal accommodating groove 33 is almost the same as or a little larger than the plate thickness of the terminal 26. The front and rear sides of a rear half elastic contact portion (a contact portion) 34 of the generally L-shaped terminal 26 are held by the terminal accommodating groove 33. And, a front half elastic contact portion (a contact portion) 35 of the terminal 26 curvedly projects upward from the terminal accommodating groove 33. A rear portion of the elastic contact portion 34 is formed straight shortly, and the front portion thereof is curved downward and continues to the elastic contact portion 35. The elastic contact portion 35 generally vertically stands along the first circuit board 7 (FIG. 1), while having a free end.

Like the above, the terminal 26 has the rear elastic contact portion 34 and the front elastic contact portion 35 almost crossing at right angles thereto. The elastic contact portion 34 is put into contact with an exposed conductor (not shown) of the second circuit board 13 (FIG. 1) elastically, and the elastic contact portion 35 is put into contact with the exposed conductor 11a of the first circuit board 7 (FIG. 1) elastically. A downward curved portion 36 between the elastic contact portions 34,35 is held by a holding wall (a holding portion) 37 integrally formed with the housing 24 at the front end thereof. The terminal 26 is made with one piece of metal.

An engaging projection 38 (FIG. 5) is provided on the lower surface of the holding wall 37 and engages an engaging hole 39 of the terminal 26. A gap 40 (FIG. 5) with a thickness not less than that of the terminal 26 is formed between a bottom surface of the terminal accommodating groove 33 and the lower surface of the holding wall 37. By inserting the elastic contact portion 34 into the gap 40 the terminal 26 can be easily assembled to the lower housing 24. The engaging projection 38 of the holding wall 37 engages the engaging hole 39 of the terminal 26, and a rear end 34a of the elastic contact portion 34 abuts a rear end of the terminal accommodating groove 33.

As shown in FIG. 3, the upper housing 23 can be easily assembled to the lower housing 24 by means of the shaft portion 30 (FIG. 2). The bearings 32 are put into contact with in the respective inner surfaces of the bearings 29 of the lower housing 24. A hinge 41 is made up of the shaft portion 30 and the bearings 29,32. The upper housing 23 has almost the same thickness, length, and width as those of the lower housing 24.

Figure 4:
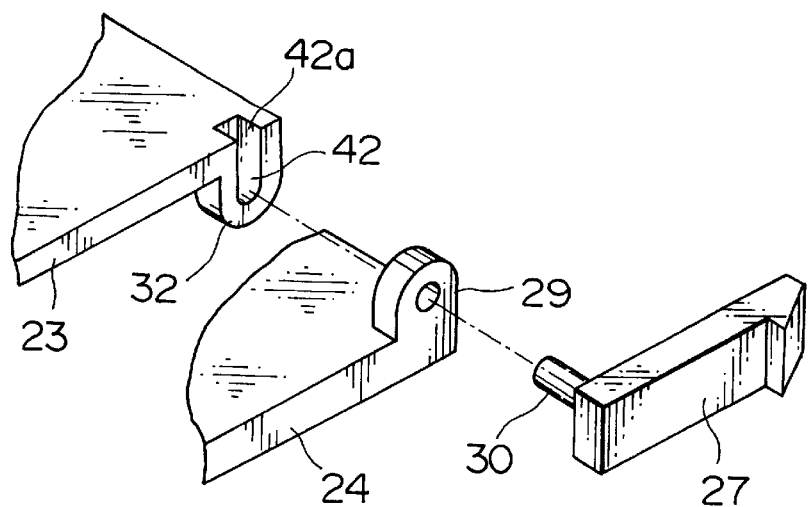
FIG. 4 is an exploded perspective view showing an assembly state of the housings with an engaging arm.

Referring to FIG. 4, the bearings 32 each having a guide groove 42 are formed integrally with the upper housing 23. Each guide groove 42 has an opening 42a. When assembled, the shaft portion 30 of the engaging arm 27 is inserted into the bearing 29 of the lower housing 24, the upper housing 23 is set upside down, the shaft portion 30 is put into the guide groove 42 through the bearing 29, and the upper housing 23 is turned by 180° toward a closing direction of the connector.

Figure 5:
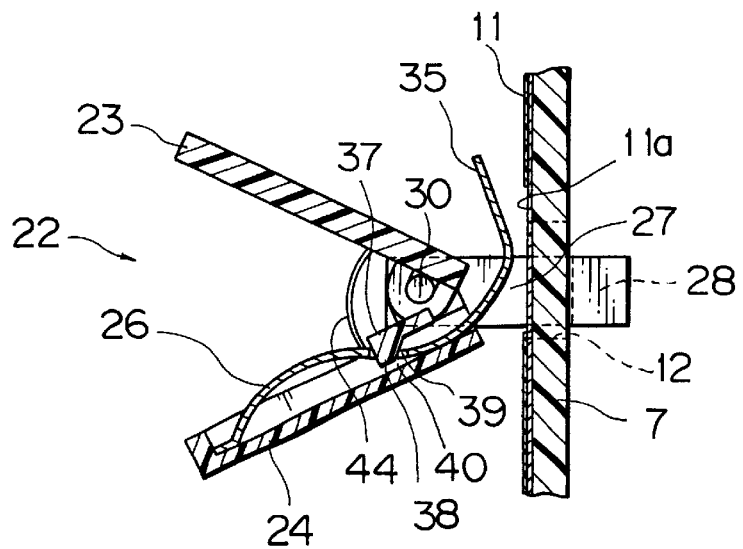
FIG. 5 is a longitudinal sectional view showing a state that the connector is fixed to a first circuit board.
Figure 6:
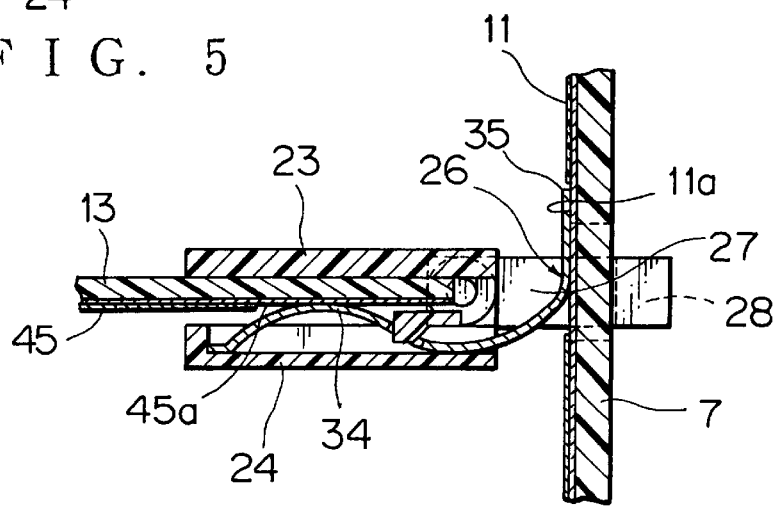
FIG. 6 is a longitudinal sectional view showing a state that a second circuit board is connected to the connector.

FIGS. 5 and 6 show a method of connecting the connector 22 to the first circuit board 7. The engaging arm 27 is engaged to the engaging hole 12 of the first circuit board 7 as shown in FIG. 5, whereby the connector 22 is fixed to the first circuit board 7. The housings 23,24 open each other to some extent by means of an elastic piece (an elastic member) 44 provided on the lower housing 24. In this opened state of the housings 23,24, the elastic contact portion 35 of the terminal 26 faces the circuit conductor 11 of the first circuit board 7 with a gap.

When both the housings 23,24 are closed horizontally as shown in FIG. 6, the terminal 26 turns toward the first circuit board 7 and is put into contact with the exposed conductor 11a elastically, while the second circuit board 13 is put into the housing 23,24 horizontally. In this state, the elastic contact portion 34 of the terminal 26 located between the housings 23,24 are in contact with the exposed conductor 45a of the circuit conductor 45 of the second circuit board 13 elastically. The upper housing 23 presses the second circuit board 13 so that the contact pressure between the exposed conductor 45a and the elastic contact portion 34 is kept high. In this way, the circuit boards 7,13 are electrically connected, and the power circuit and/or the signal circuit are connected between the instrument panel and the accessory. The housing 23,24 are kept in a closed state by a non-shown engaging means.

Figure 7:
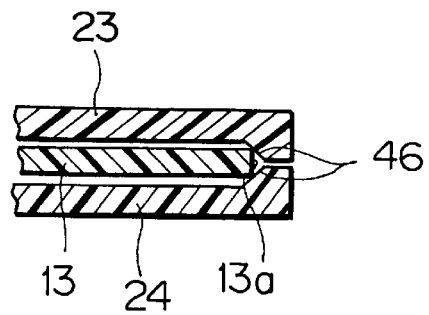
FIG. 7 is a longitudinal sectional view partly showing the connector in a closed state.

As shown in FIG. 7, a sloping portion 46 may be formed inside the front end of each of the housings 23,24 for facilitating the closing operation of the housings 23,24. The housings 23,24 can be closed by pushing the sloping portions 46 by the corners of an end 13a of the second circuit board 13. Here, when the second circuit board 13 is inserted between the housings 23,24, the elastic piece 44 (FIG. 5) is pushed by the end 13a of circuit board 13 and lies.

Figure 8:
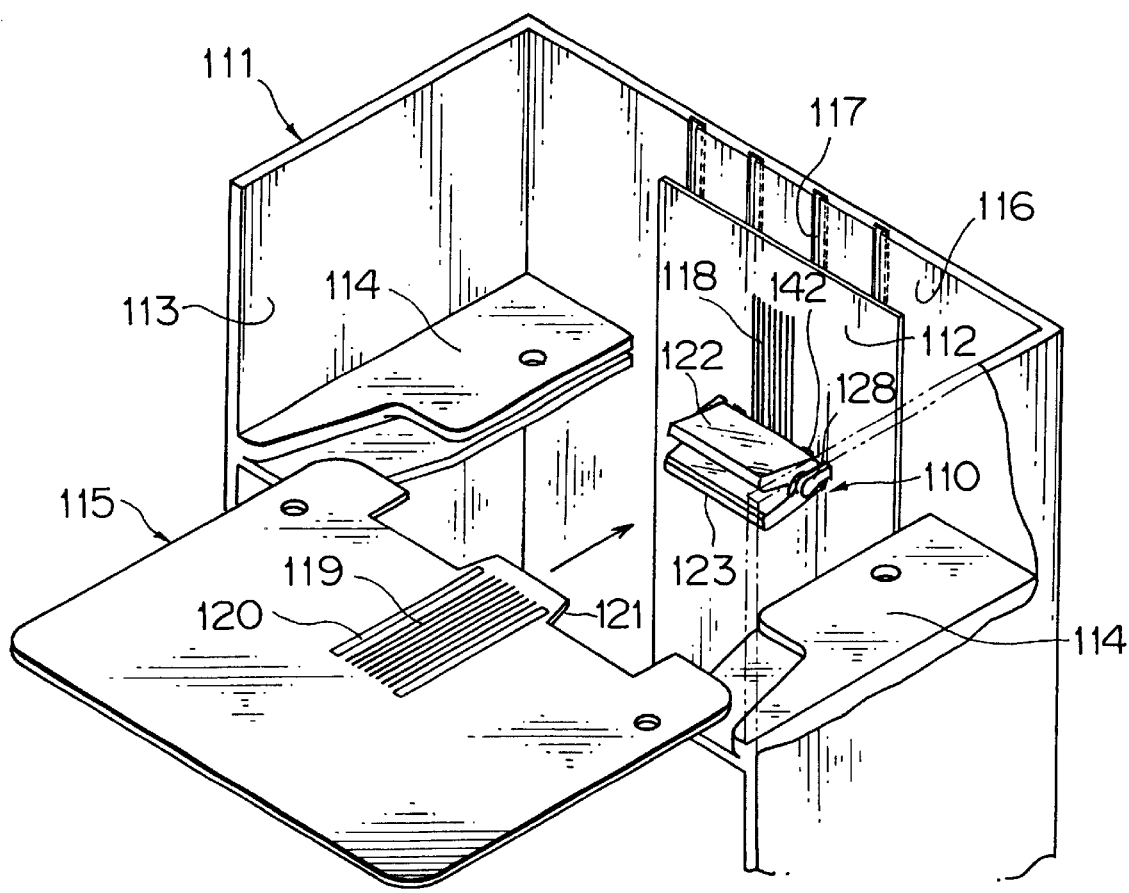
FIG. 8 is an exploded perspective view showing a second embodiment of a connector and a connecting structure of circuit boards therewith in accordance with the present invention.

FIGS. 8–14 show a second embodiment of a connector and a connecting structure of circuit boards therewith in accordance with the present invention. In the connecting structure of the present embodiment, as shown in FIG. 8, a vertical first circuit board 112 arranged inside a casing 111 which is an instrument panel core of a motor vehicle, a horizontal second circuit board 115 to be inserted into guide portions 114, a vertical third circuit board 116 utilizing the rear board of the casing 111 and having vertical power bus bars 117 are connected by means of a connector 110.

A plurality of vertical circuit conductors (printed conductors) 118 of the first circuit board 112 are signal ones. A plurality of circuit conductors (printed conductors) 119, 120 on the face of the second circuit board 115 are signal and power ones. The center and the both sides of the second circuit board 115 project forward, and the distal ends of the circuit conductors 119,120 are arranged on the projecting portion 121 at the center. The other structure other than the above is similar to the embodiment of FIG. 1.

Figure 9:
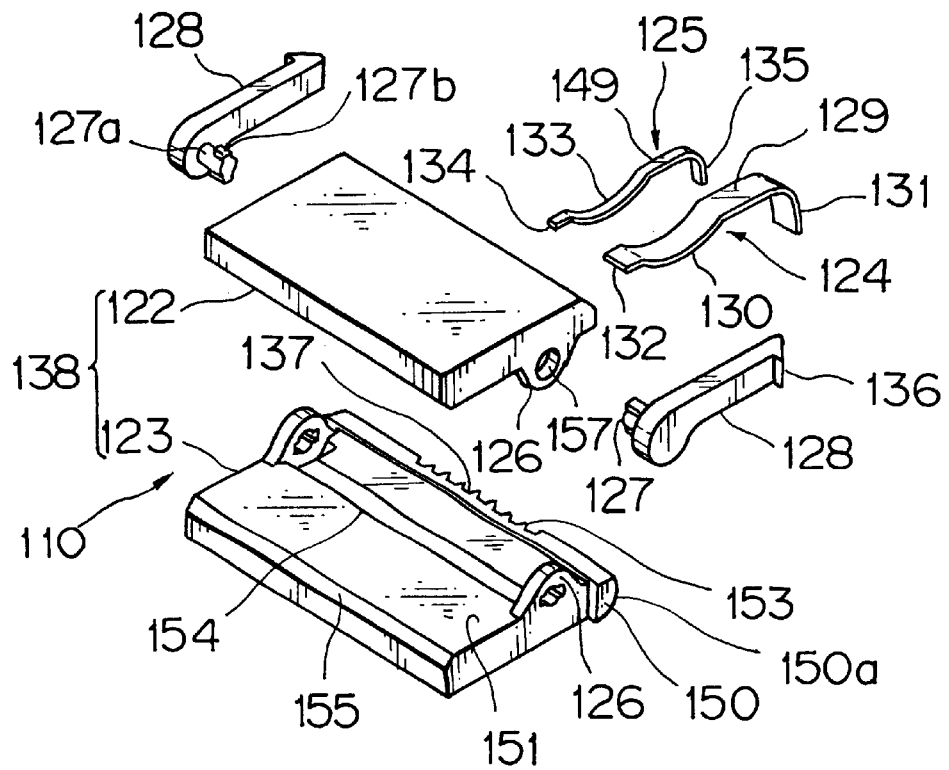
FIG. 9 is an exploded perspective view showing the connector of FIG. 8.
Figure 10:
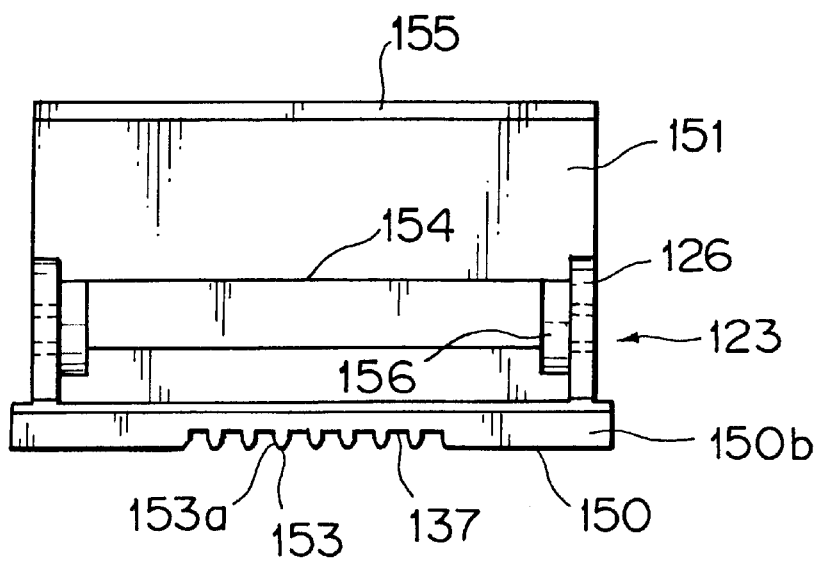
FIG. 10 is a plan view showing a lower housing of the connector.

FIG. 9 shows the connector 110 having upper and lower housings 122,123 made of synthetic resin, wide power and narrow signal terminals 124,125 arranged on the upper housing 122, and engaging arms 128 to be turnable about respective shaft portions 127 of hinge portions 126 of the housings 122,123.

Differently from the connector 22 of FIG. 1, the connector 110 has the signal terminals 125 (only one is shown) and the power terminals 124 (only one is shown), the terminals 124,125 face downward, and the grooves (positioning portion) 137 for positioning the signal terminals 125 are formed at a front end portion 150 of the lower housing 123. The present embodiment is characterized in that the narrow terminals 125 are accommodated in one housing 122 and grooves 137 as the positioning portion of the terminals 125 are provided at the front end 150 of the other housing 123.

The power terminal 124 is formed of a piece of conductive metal plate and longer than the signal terminal 125. The power terminal 124 has an elastic contact portion 130 projecting downward in a circular-arc at the rear of a middle base-plate portion 129 and also has an elastic contact portion 131 bent downward at the front of the middle base-plate portion 129. A short straight portion (an end portion) 132 continues from the elastic contact portion 130. The elastic contact portion 131 is put into contact with the busbar 117 of the third circuit board 116 of FIG. 13, and the elastic contact portion 130 is put into contact with the circuit conductor 120 of the second circuit board 115.

The signal terminal 125 has a shape similar to the power terminal 124 as shown in FIG. 9. Specifically, its middle base-plate portion 149 is shorter than that of the middle base-plate portion 129 of the power terminal 124. The signal terminal 125 is formed of a piece of conductive metal plate. As shown in FIG. 9, the signal terminal 125 has an elastic contact portion (a contact portion) 133, a straight portion (an end portion) 134, a middle base-plate portion 149, and an elastic contact portion (a contact portion) 135.

The connector housing 138 consists of the upper and lower housings 122,123. As show in FIGS. 10–12, the lower housing 123 has a generally rectangular base plate portion 151, a front end portion 150 formed in front of the base plate portion 151, and a pair of semicircular bearings 126 standing on both sides of the base plate portion 151 on the rear side of the front end portion 150. A front end surface 150*a* of the front end portion 150 curves in a circular-arc about an axis of the hole portions 152 of the bearings 126 as shown in FIG. 12, and then a top 150*a*' of the front end surface 150*a* projects forward when the housing 123 is horizontally placed.

A plurality of grooves 137 for terminal-positioning are formed on the end plane 150*a* in parallel, curving in a circular-arc about the axis of the hole portions 152 of the bearings 126. A section wall 153 is formed between the grooves 137 in a circular-arc. The width of the section wall 153 is smaller than that of the groove 137. A tapered guide surface 153*a* (FIG. 10) is formed on both sides of the front end of each section wall 153 so as to guide the terminal 125 inside the groove 137. The width of the groove 137 is a little larger than that of the terminal 125.

The base plate portion 151 is dug a little between the right and left bearings 126. As shown in FIG. 9, the rear half of the base plate portion 151 is higher than the front half through a step 154 so that the elastic contact portions 130,133 of the terminals 124,125 can be securely pressed against the second circuit board 115 (FIG. 13). A tapered guide surface 155 is formed on the rear end of each of the housings 122,123 for easier setting or insertion of the second circuit board 115.

A recess 156 is formed just inside each bearing 126 on the base plate portion 151 for receiving each bearing 126 on the upper housing 122. The hole portion 152 of the bearing 126 of the lower housing 123 has a small-diameter circular portion 152*a* and a pair of rectangular portions 152*b* formed on the circular portion 152*a*. The hole portion 157 of the upper bearing 126 has a large-diameter circular portion. The upper bearings 126 are arranged just inside the lower bearing 126.

The shaft portion 127 of the engaging arm 128 (FIG. 9) also has a small-diameter cylindrical portion 127*a* and rectangular portions 127*b* projecting from the portion 127*a* at its distal end. The shaft portion 127 is put through the lower bearing 126, while preventing the shaft portion 127 from coming out thereof. And, the shaft portion 127 is pivotably arranged inside a hole portion 157 of the upper bearing 126.

Referring to FIG. 13, the upper housing 122 has terminal accommodating grooves 139 in parallel. The upper housing 122 has holding walls (a holding portion) 140 to hold the middle base-plate portions 129,149 of the terminals 124,125 at the front end thereof, and groove portions 141 to hold the straight portions 132,134 of the terminals 124,125 at the rear end thereof. The holding wall 140 is provided for each terminal accommodating groove 139. A wide terminal accommodating groove for the power terminal 64 is formed on both sides of the housing 122, and narrow terminal accommodating grooves 139 for the respective signal terminals 125 are arranged inside thereof.

Also referring to FIG. 13, when the housings 122,123 are in an opened state, the elastic contact portions 131 of the power terminals 124 project forward more than the signal terminals 125 and are put into slight contact with the busbars 117 of the third circuit board 116. The elastic contact portions 135 (FIG. 9) of the signal terminals 125 are put into slight contact with the circuit conductors 118 of the first circuit board 112 (FIG. 8). The engaging arms 128 are put through both of the vertical circuit boards 112,116, and the engaging claws 136 engage the back of the third circuit board 116.

In FIG. 13, the elastic contact portions 130 of the power terminals 124 project downward from the upper housing 122, and the rear straight portions 132 engage the grooves 141 of the housing 122. Hole portions 142 (FIG. 8) to receive the respective elastic contact portions 131 of the power terminals 124 are provided on the first circuit board 112.

The signal terminals 125 are held between the holding walls 140 and the base plate portion 143 of the housing 122 in almost the same state as the power terminals 124.

The terminals 124,125 are attached to the upper housing 122 from their rear end through respective hole portions 140*a* between the holding walls 140 and the base plate portion 143 of the upper housing 122. The straight portions 132,134 are inserted in the groove portions 141.

A root portion of the elastic contact portion 135 of each terminal 125 engages the groove 137 the lower housing 123 so that the elastic contact portions 135 are arranged in parallel each other, whereby short circuit between the terminals 125 is prevented. Like this, the narrow elastic contact portions 135 are accurately positioned relative to the narrow circuit conductors 118 of the first circuit board The upper and lower housings 122,123 are turnable each other abut the hinges, i.e. the shaft portions 127 and the bearings 126. The second circuit board 115 is inserted into the rear opening 144 between the housings 122,123. The second circuit board 115 is connected to an accessory such as an electrical appliance.

Figure 14:
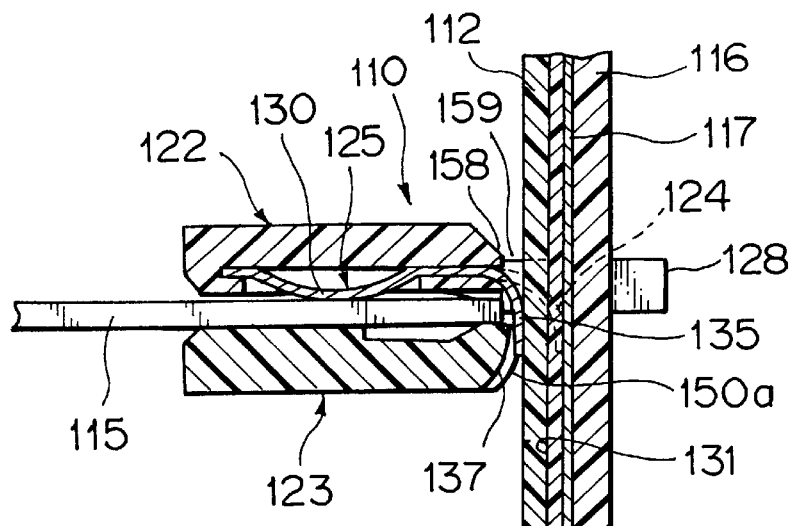
FIG. 14 is a longitudinal sectional view showing a state that both the circuit boards are connected with the connector.

As shown in FIG. 14, when the second circuit board 115 is inserted, upper and lower corners of the front end thereof abut sloping portions (not shown) provided at the respective inside front ends of the housings 122,123 so as to close the housings 122,123 close. And, the rear elastic contact portions 130,133 of the terminals 124,125 are put into contact with the circuit conductors 119 of the second circuit board 115 elastically, and simultaneously the elastic contact portions the front elastic contact portions 131,135 are put into contact with the busbars 117 of the third circuit board 116 and with the circuit conductors 118 of the first circuit board 112 elastically and sufficiently strongly. When the housings 122,123 close, the terminals 124,125 turn along with the upper housing 122, the front elastic contact portions 131,135 are pushed out forward.

When the second circuit board 115 has been put inside the connector 110 as shown in FIG. 14 from a state of FIG. 13, the connector 110 is pushed toward the first circuit board 112. In this state, the root portions of the elastic contact portions 135 of the terminals 125 have got inside the grooves 137 of the lower housing 123. And, the curved front end surface 150a of the lower housing 123 abuts the first circuit board 112, the front portions of the elastic contact portions 135 are in contact with the circuit conductors 118 of the first circuit board 112.

As shown in FIG. 14, when the housings 122,123 are in a closed state, the front end portion 158 of the upper housing 122 is positioned a little more behind than the front end portion 150 of the lower housing 123. That is, a small gap 159 is provided between the front end portion 158 of the upper housing 122 and the first circuit board 112, and the root portions of the elastic contact portions 135 of the signal terminals 125 are bent in the gap 159.

The second circuit board 115 is put into the connector 110 from the state of FIG. 13, and the circular-arc front end surface 150a of the lower housing 123 is abutting the insulated portion of the face of the first circuit board 112, when the housings 122,123 turn about the hinges 126,127 in the closing direction. This turning operation can be smoothly done with a small force since due to the circular-arc front end surface 150a and also due to the above gap 159. Here, the above grooves 137 may be replaced with projections.

Figure 15:
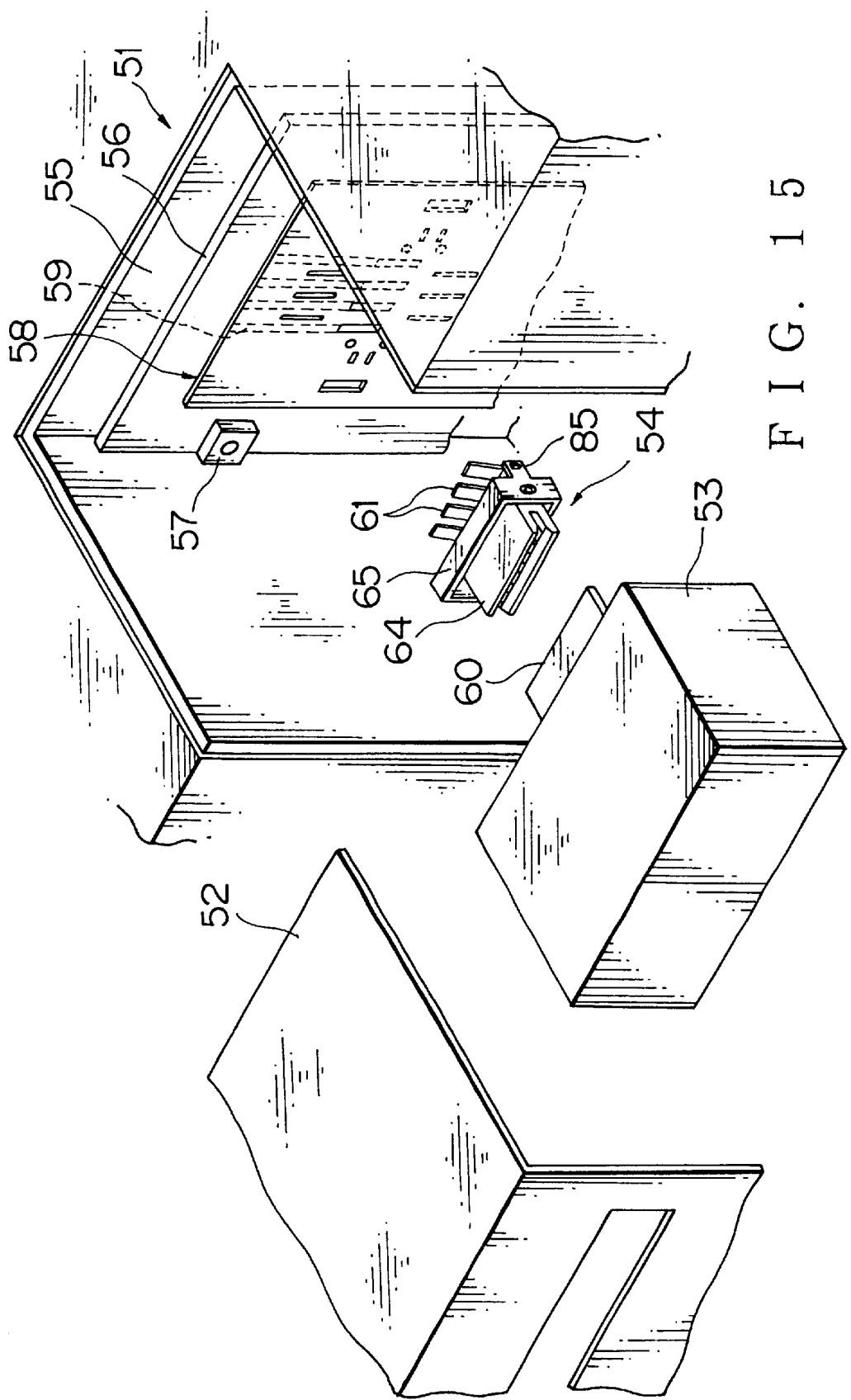
FIG. 15 is an exploded perspective view showing a third embodiment of a connector and a connecting structure of circuit boards therewith in accordance with the present invention.
Figure 1:
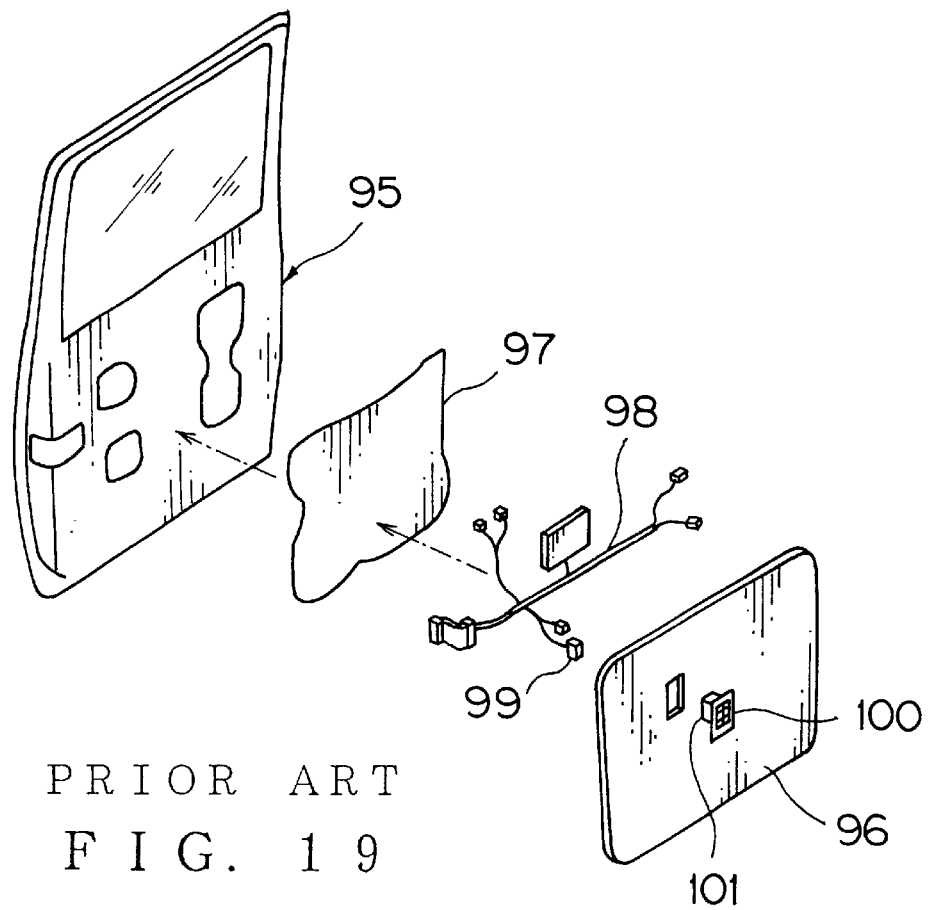
Figure 20:
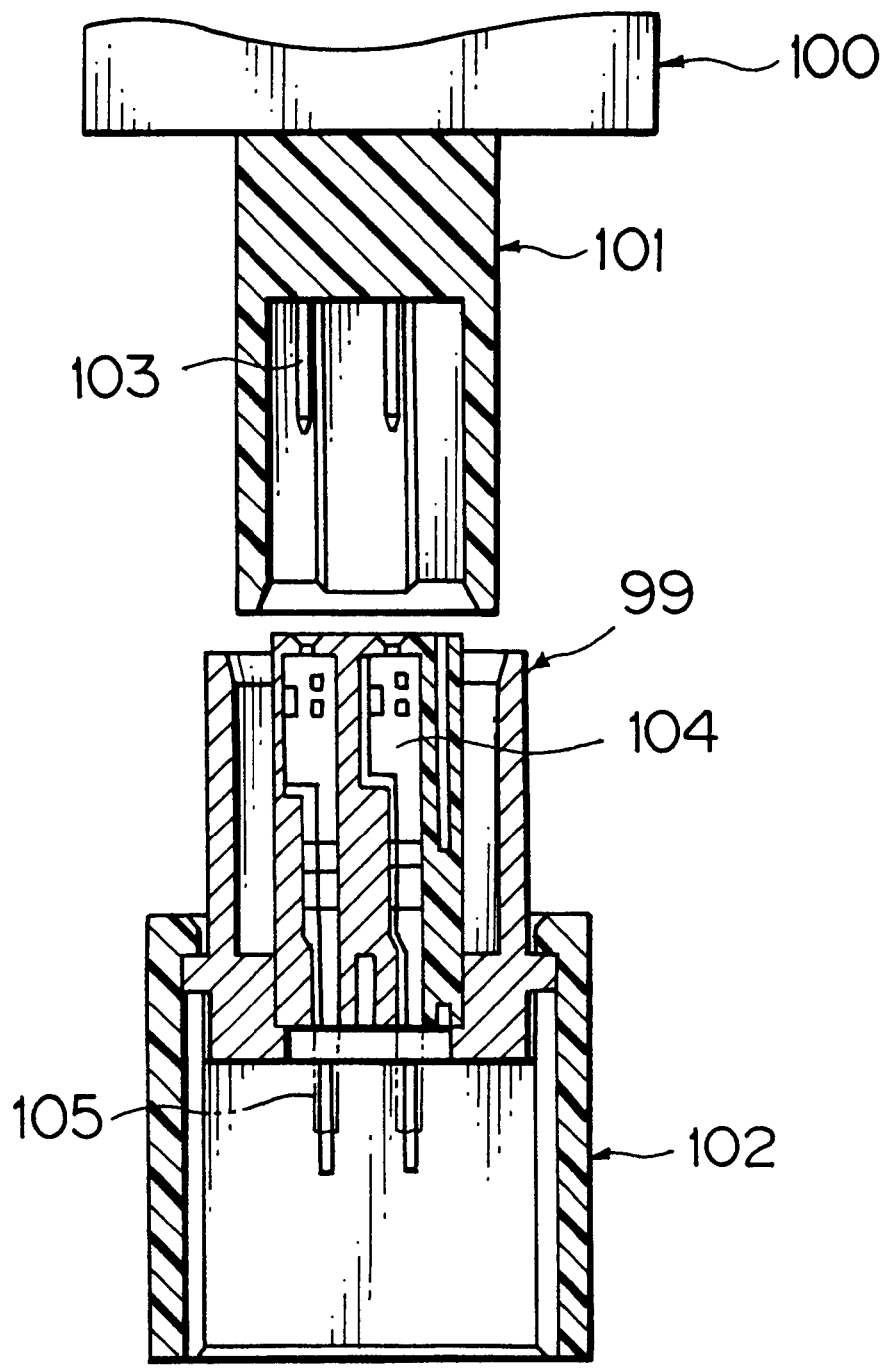
FIG. 20 is a longitudinal sectional view showing a connector of FIG. 20.

FIGS. 15–17 show a third embodiment of a connector and a connecting structure of circuit boards therewith in accordance with the present invention.

In FIGS. 15, 51, 52, 53, and 54 designate a casing as an instrument panel core, a cover as a cluster, an accessory such as a switch unit or an audio system, and a connector connected to the accessory, respectively.

A panel 56 is vertically fixed with guide portions 57 (only one is shown) inside a space 55 of the casing 51. A first circuit board 58, to be thin and resilient, is fixed to the panel 56 by a non-shown engaging means such as a FFC (a flexible flat circuit board) and a FPC (a flexible printed circuit plate). The first circuit board 58 may be secured to the panel 56 by only an engaging plate 85 of a connector 54. A plurality of circuit conductors 59 are vertically provided on the first circuit board 58 which is a circuit assembly on a side of an instrument panel.

A second circuit board 60 is protrusively-provided on the accessory 53 in a horizontal direction. The second circuit board 60 is of a FFC, a FPC, or a rigid circuit board. Generally L-shaped terminals 63 (FIG. 16) having electrically contacting portions 61 for the first circuit board 58 and electrically contacting portions 62 (FIG. 16) for the second circuit board 60 are arranged in parallel on the connector 54.

As shown in FIG. 16, the connector 54 has a moving-side housing 64 to accommodate the terminals 63 and a fixed-side housing 65 arranged outside the moving-side housing 64. The moving-side housing 64, as shown in FIG. 15, projects from the fixed-side housing 65 in a connector detaching direction (the rearward). The housings 64,65 are made of insulative synthetic resin, and a connector housing 66 consists of the moving-side housing 64 and the fixed-side housing 65.

The moving-side housing 64 is formed in a generally block shape and has terminal accommodating portions 67. A pair of cylindrical shaft portions 69 for engaging the fixed-side housing 65 is protrusively-provided horizontally on the respective sidewalls 68 of the moving-side housing 64. Engaging projections 70 for the first circuit board 58 (FIG. 15) project forward on the front end of the moving-side housing 64.

Slit-like (or groove-like) opening portion 72 continuing to the terminal accommodating portions 67 is formed at the rear end portion of the moving-side housing 64. The front end portion of the second circuit board 60 (FIG. 15) for the accessory is inserted into the opening portion 72. Tapered guide planes 73 for smoothly inserting the second circuit board 60 are formed at the inlet of the opening portion 72.

The terminals 63 each are formed in a generally L-shape and each have a rear electrically contacting portion (a contact portion) 62 to be accommodated in the terminal accommodating portion 67 and an elastic contact portion (a contact portion) 61 which is an electrically contacting portion exposed at the front side. Each electrically contacting portion 62 has a base plate portion 74 formed horizontal at the bottom, an elastically contacting piece (an elastic contact portion) 75 folded back from the rear end of the base plate portion 74, a holding wall 76 positioned over the elastically contacting piece 75, sidewalls 77 connecting the base plate portion 74 and the holding wall 76. A front end portion of the second circuit board 60 of the accessory is inserted between the holding wall 76 and the elastically contacting piece 75, and then an exposed conductor (not shown) of the second circuit board 60 and the elastically contacting piece 75 is put into electrical contact.

The base plate portion 74 continues to the electrically contacting portion (the elastic contact portion) 61 through a bent portion 78. The elastic contact portion 61 projects from the front end of the fixed-side housing 65 as shown in FIG. 16, while having an upward free end 61a. The elastic contact portion 61 may be upwardly straight, slightly curved or in a generally circular shape.

Referring to FIG. 17, the electrically contacting portion 62 of the terminal 63 is accommodated in the terminal accommodating portion 67 of the moving-side housing 64. The terminal accommodating portion 67 consists of up and down terminal accommodating grooves facing each other.

The terminal accommodating portions 67 are arranged in parallel and have the opening portion 72 in common. An engaging projection 81 is formed at the front end of an upper wall 79, and an engaging projection 82 is formed at the rear ends (i.e. the opening portion side) of the upper wall 79 and a lower wall 80. The generally boxlike electrically contacting portion 62 is retained by means of the engaging projections 81,82. A front half 74a of the base plate portion 74 of the terminal 63 projects from the front end of the moving-side housing 64 forward and continues to the upward elastic contact portion 61.

Referring again to FIG. 16, the fixed-side housing 65 is formed in a block-like shape and has engaging holes (engaging portions) 84 for the respective shaft portions 69 of the moving-side housing 64 on the respective right and left sidewalls 83. The engaging hole 84 is of a vertical slot. The moving-side housing 64 can shift inside the fixed-side housing 65 in a range defined by the engaging hole 84, i.e. the slot, versus the shaft portion 69. The width of the engaging holes 84 may be larger than the respective shaft portions 69. The connector 54 has an attaching tolerance, for a longitudinal position divergence, by means of the deformation of the elastic contact portion 61 of the terminal 63. The shaft portions 69 and the engaging holes 84 may be replaced each other.

And, the moving-side housing 64 can shift laterally, i.e. in an axial direction of the shaft portions 69, inside the. fixed-side housing 65. The length of the shaft portions 69 is designed to allow this shift.

An engaging plate (an engaging member) 85 for the panel 56 (FIG. 15) projects toward from each of the sidewalls 83. Each engaging plate 85 is formed in a generally rectangular shape and has an engaging projection 86 on the outside surface thereof. Each engaging, projection 86 has a slant plane 86a on its front side and a vertical engaging plane 86b on its rear side. The engaging plate 86 has a resilience in its thickness direction, that is, in a horizontal direction perpendicular to the longitudinal axis of the connector 54.

Figure 18:
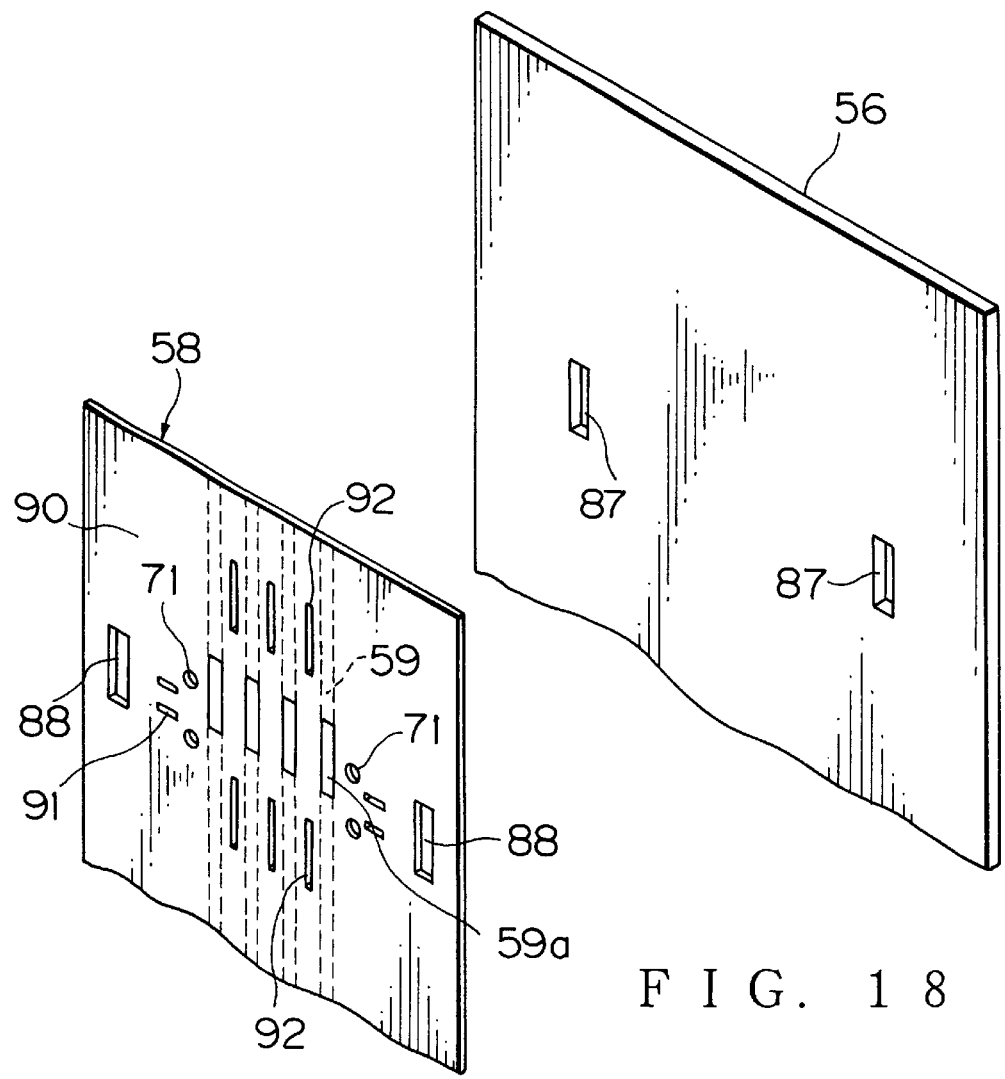
FIG. 18 is a perspective view showing a first circuit board and a panel.

As shown in FIG. 18, a pair of rectangular engaging holes (engaging portions) 87 to receive the respective engaging plates 85 and to engage the respective engaging projections 86 are provided on respective right and left sides of the panel 56. Similarly, a pair of rectangular through holes (engaging holes or engaging portions) 88 corresponding to the engaging holes 87 are provided on the first circuit board 58. The engaging plates 85 are put through the respective through holes 88 and the respective engaging holes 87, and the engaging projections 86 engage the back of the engaging holes 87.

With the above structure, the fixed-side housing 65 is secured to the panel 56, and the first circuit board 58 is put between the panel 56 and the front end 89 of the fixed-side housing 65 and fixed. In this case, a distance from the engaging plane 86b of the engaging projection 86 is almost equal to the total thickness of the first circuit board 58 and the panel 56. The width of each hole 88 is preferably set larger than the thickness of each engaging plate 85 so as to absorb a later-described position divergence.

Two right and two left circular engaging holes 71 for the respective engaging projections 70 of the moving-side housing 64 are arranged on the first circuit board 58 inside the through holes 88 thereon. The engaging projections 70 each having a rectangular cross-section easily engage inside the respective circular engaging holes 71 without rickety. Here, the engaging projections 70 each have a circular cross-section.

The engaging projections 70 engage the respective engaging holes 71, and positioning of the moving-side housing 64 to the first circuit board 58 is accurately carried out. Between the right and left pairs of engaging holes 71, the circuit conductors 59 are vertically arranged in parallel on the circuit board 58. A part of each of the circuit conductors 59 is exposed from the insulating cover. That is, the exposed conductors 59a are vertically arranged in parallel on the circuit board 58.

As shown in FIG. 15, the fixed-side housing 65 is fixed to the panel 56 by engaging the engaging plates 85 with the engaging holes 87 through the through holes 88 in a state that the moving-side housing 64 accommodating the terminals 63 is assembled to the fixed-side housing 65. And, the engaging projections 70 of the moving-side housing 64 engage the engaging holes 71 of the first circuit board 58. And, the second circuit board 60 is inserted into the moving-side housing 64, whereby the elastic contact portions 61 of the terminals 63 are accurately put into contact with the exposed conductors 59a without a position divergence.

Further, on the resilient insulated board or portion 90 of the first circuit board 58, two pairs of horizontally long slots (slot portions) 91 are provided outside the engaging holes 71 and inside the through holes 88. And, also on the insulated portion 90 of the first circuit board 58, six of vertically long slots 92 (slot portions) are provided between each two circuit conductors 59. Specifically, three slots 92 are arranged above the respective exposed conductors 59a, and another three slots 92 are arranged below the respective exposed conductors 59a.

That is, though the moving-side housing 64 is likely to move laterally and vertically relative to the panel 56 due to movement of the second circuit board 60 connected to the accessory (FIG. 15), the position divergence can be absorbed by means of the slots 91,92 since a portion of the first circuit board 58 enclosed or sectioned with the slots 91,92 can move laterally and vertically in a plane due to the flexibility of the first circuit board 58. With this structure the elastic contact portions 61 of the terminals 63 can be always in good contact with the exposed conductors 59a.

Referring to FIG. 16, a longitudinal position divergence of the moving-side housing 64 with respect to the fixed-side housing 65 can be absorbed by a gap between the engaging hole 84 and the shaft portion 69. In this case, the elastic contact portions 61 of the terminals 63 keep in contact with the exposed conductors 59a of the first circuit board 58 (FIG. 18) with the resilience of the elastic contact portions 61.

Although the present invention has been fully described by way of examples with reference to the accompanying drawings, it is to be noted that various changes and modifications will be apparent to those skilled in the art. Therefore, unless otherwise such changes and modifications depart from the scope of the present invention, they should be construed as being included therein.

What is claimed is:

1. A connector for connecting orthogonally arranged circuit boards, comprising:
   a first circuit board;
   a second circuit board orthogonally arranged relative to the first circuit board;
   a single piece terminal having first and second contact portions for the respective first and second circuit boards; and
   a housing assembly, having an engaging member, having an engaging arm projecting from the housing assembly toward the first circuit board and an engaging portion formed on a distal end of the engaging arm, for attaching the housing assembly to the first circuit board, to accommodate the terminal, wherein an end of said second circuit board is disposed inside said housing assembly.

2. The connector as set forth in claim 1, wherein the first contact portion projects in a same direction as the engaging member.

3. The connector as set forth in claim 2, wherein the engaging member is pivotable independently from the housing assembly.

4. The connector as set forth in claim 2, wherein the engaging member is longitudinally movable at an engaging portion provided on the first circuit board.

5. The connector as set forth in claim 1, wherein the housing assembly consists of a pair of housings turnable about a hinge, and the second contact portion of the terminal is accommodated between the pair of housings.

6. The connector as set forth in claim 5, wherein a shaft portion of the hinge is formed integrally with the engaging member.

7. The connector as set forth in claim 5, wherein an elastic member is provided between the pair of housings, and the housings open each other by means of the elastic member in such a manner that the opened state supported by the elastic member is removed by the end of the second circuit board.

8. The connector as set forth in claim 5, wherein the housings have respective opposite sloping portions on which the end of the second circuit board abuts for closing the housings.

9. The connector as set forth in claim 5, wherein a holding portion to hold a middle portion of the terminal is provided on a first housing of said pair of housings.

10. The connector as set forth in claim 2, wherein the housing assembly consists of a fixed-side housing having the engaging member for the first circuit board and a moving-side housing movable relative to the fixed-side housing, and the terminal is accommodated in the moving-side housing.

11. The connector as set forth in claim 10, wherein a shaft portion is provided on either one of the fixed-side housing and the moving-side housing, and a shaft engaging portion to movably engage the shaft portion is provided on the other of the fixed-side housing and the moving-side housing.

12. The connector as set forth in claim 11, wherein the moving-side housing is movable in the fixed-side housing in an axial direction of the shaft portion.

13. A connecting structure of the circuit boards with the connector set forth in claim 10, wherein a casing encloses the connecting structure and a panel is vertically fixed inside the casing, and the first circuit board is resilient, and a connector engaging portion to engage the engaging member which is projected from the fixed-side housing is formed through both of the first circuit board and the panel so that the first circuit board is supported by the engaging member.

14. The connecting structure as set forth in claim 13, wherein a moving-side housing engaging portion is provided on the first circuit board, and an engaging portion for the moving-side housing engaging portion is provided on the moving-side housing.

15. The connecting structure as set forth in claim 14, wherein a plurality of slots are provided on the first circuit board so as to permit the first circuit board to be bent.

16. The connecting structure as set.. forth in any one of claims 13–15, wherein the first circuit board is securely put between the fixed-side housing and the panel in a state that the engaging member engages the connector engaging portion of the panel.

17. The connector as set forth in any one of claims 1–12, wherein the terminal is formed generally in a L-shape, and the first and second contact portions of the terminal are first and second elastic contact portions, respectively.

18. The connector as set forth in claim 17, wherein a positioning portion to engage the first elastic contact portion of the terminal is provided on a front end portion of the housing assembly.

19. The connector as set forth claim 18, wherein the positioning portion is provided on a second of the pair of housings set forth in claim 9.

20. The connector as set forth in claim 18, wherein the positioning portion is a groove to receive the first elastic contact portion therein.

21. The connector as set forth in claim 18, wherein the front end portion of the housing having the positioning portion is a circular-arc surface formed about the hinge as a center thereof.

* * * * *